(12) United States Patent
Kim et al.

(10) Patent No.: US 10,031,418 B2
(45) Date of Patent: Jul. 24, 2018

(54) PHOTOSENSITIVE RESIN COMPOSITION, PHOTOSENSITIVE RESIN FILM USING THE SAME AND COLOR FILTER

(71) Applicant: Samsung SDI Co., Ltd., Yongin-si (KR)

(72) Inventors: Lee-June Kim, Suwon-si (KR); Jee-Hyun Ryu, Suwon-si (KR); Jung-Hwa Lee, Suwon-si (KR); Ju-Ho Jung, Suwon-si (KR); Seung-Jib Choi, Suwon-si (KR); Soo-Young Heo, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 268 days.

(21) Appl. No.: 14/932,135

(22) Filed: Nov. 4, 2015

(65) Prior Publication Data
US 2016/0139507 A1 May 19, 2016

(30) Foreign Application Priority Data
Nov. 17, 2014 (KR) .................. 10-2014-0160355

(51) Int. Cl.
| | | |
|---|---|---|
| G02B 5/23 | (2006.01) |
| G03F 7/033 | (2006.01) |
| G03F 7/00 | (2006.01) |
| G03F 7/032 | (2006.01) |
| G03F 7/038 | (2006.01) |
| G02B 5/22 | (2006.01) |

(52) U.S. Cl.
CPC ............ *G03F 7/033* (2013.01); *G03F 7/0007* (2013.01); *G03F 7/032* (2013.01); *G03F 7/0388* (2013.01); *G02B 5/223* (2013.01)

(58) Field of Classification Search
USPC ..... 252/586, 582; 430/7, 270.1, 281.1–287.1
See application file for complete search history.

(56) References Cited

U.S. PATENT DOCUMENTS

| | | | |
|---|---|---|---|
| 8,273,270 B2 | 9/2012 | Lee et al. | |
| 8,980,528 B2 | 3/2015 | Lee et al. | |
| 9,005,491 B2 | 4/2015 | Lee et al. | |
| 2011/0151379 A1 | 6/2011 | Choi et al. | |
| 2012/0091407 A1* | 4/2012 | Lee ................... | G03F 7/032 252/582 |
| 2013/0001483 A1* | 1/2013 | Lee ................... | G03F 7/033 252/586 |
| 2014/0045121 A1 | 2/2014 | Lee et al. | |
| 2015/0125789 A1 | 5/2015 | Park et al. | |

FOREIGN PATENT DOCUMENTS

| | | |
|---|---|---|
| JP | 2013-134263 | 7/2013 |
| KR | 10-0838452 B1 | 6/2008 |
| KR | 10-1068622 | 9/2011 |
| KR | 10-2012-0045076 A | 5/2012 |
| KR | 10-2012-0045077 A | 5/2012 |
| KR | 10-2013-0002789 A | 1/2013 |
| KR | 10-1282516 | 6/2013 |
| KR | 10-2013-0132322 A | 12/2013 |
| KR | 10-2014-0020536 A | 2/2014 |
| KR | 10-2014-0072681 A | 6/2014 |

OTHER PUBLICATIONS

Search Report in counterpart Taiwanese Application No. 104131970 dated Dec. 25, 2016, pp. 1.
English-translation of Search Report in counterpart Taiwanese Application No. 104131970 dated Dec. 25, 2016, pp. 1.

* cited by examiner

*Primary Examiner* — Monique Peets
(74) *Attorney, Agent, or Firm* — Additon, Higgins & Pendleton, P.A.

(57) ABSTRACT

A photosensitive resin composition includes (A) an acrylic-based binder resin including a repeating unit represented by Chemical Formula 1, wherein in Chemical Formula 1, each substituent is the same as defined in the detailed description; (B) a cardo-based binder resin including a repeating unit represented by Chemical Formula 2-1 and a repeating unit represented by Chemical Formula 2-2, wherein in Chemical Formula 2-1 and 2-2, each substituent is the same as defined in the detailed description; (C) reactive unsaturated compound; (D) an initiator; (E) a colorant; and (F) a solvent. A photosensitive resin film using the same and a color filter is also provided.

14 Claims, 8 Drawing Sheets

PHOTOSENSITIVE RESIN COMPOSITION, PHOTOSENSITIVE RESIN FILM USING THE SAME AND COLOR FILTER

CROSS-REFERENCE TO RELATED APPLICATION

This application claims priority to and the benefit of Korean Patent Application No. 10-2014-0160355 filed in the Korean Intellectual Property Office on Nov. 17, 2014, the entire disclosure of which is incorporated herein by reference.

FIELD OF THE INVENTION

This disclosure relates to a photosensitive resin composition, a photosensitive resin film using the same and a color filter.

BACKGROUND

A photosensitive resin composition can be coated on a substrate to form a film, exposed through photo-radiation by using a photomask and the like in a particular region of the film, and developed to remove the non-exposed region, thereby manufacturing a photosensitive resin film having a pattern thereon. This photosensitive resin composition can be polymerized and cured by radiating light and thus has been used for a photocurable ink, a photosensitive printing plate, various photoresists, a color filter photoresist for a liquid crystal display (LCD), a photoresist for a resin black matrix, a transparent photosensitive material and the like.

A binder resin of the photosensitive resin composition can improve adherence to the substrate and can make the photosensitive resin composition coatable. The binder resin also can be dissolved in an alkali developing solution and can form a fine pattern and simultaneously can strengthen the pattern and thus can prevent the pattern from collapse during a post processing step. In addition, the binder resin can have a large influence on heat resistance and chemical resistance of the photosensitive resin film.

However, since a photosensitive resin composition including a conventional binder resin mostly leaves lots of water spots in a pattern, and the pattern also can have a high tapered angle, there can be difficulties realizing a fine pattern using the same. Therefore, there is a need for a binder resin that can minimize water spots, maintain a low taper angle, and provide a fine pattern.

SUMMARY

One embodiment provides a photosensitive resin composition that is capable of realizing a fine pattern.

Another embodiment provides a photosensitive resin film manufactured using the photosensitive resin composition.

Yet another embodiment provides a color filter including the photosensitive resin film.

One embodiment provides a photosensitive resin composition including (A) an acrylic-based binder resin including a repeating unit represented by Chemical Formula 1; (B) a cardo-based binder resin including a repeating unit represented by Chemical Formula 2-1 and a repeating unit represented by Chemical Formula 2-2; (C) a reactive unsaturated compound; (D) an initiator; (E) a colorant; and (F) a solvent.

[Chemical Formula 1]

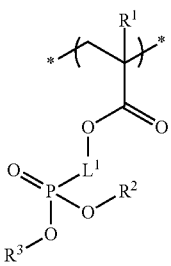

[Chemical Formula 2-1]

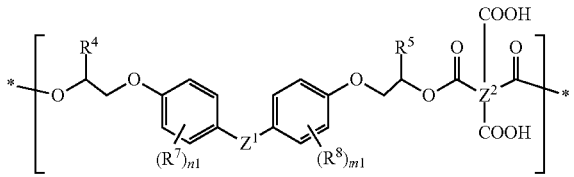

[Chemical Formula 2-2]

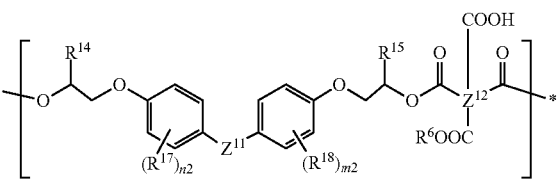

In Chemical Formula 1,
$R^1$ is hydrogen or a substituted or unsubstituted C1 to C20 alkyl group,
$R^2$ and $R^3$ are the same or different and are each independently hydrogen, a substituted or unsubstituted C1 to C20 alkyl group, a substituted or unsubstituted C3 to C20 cycloalkyl group or a substituted or unsubstituted C6 to C20 aryl group, and
$L^1$ is a substituted or unsubstituted C1 to C20 alkylene group,
in Chemical Formulae 2-1 and 2-2,
$R^4$, $R^5$, $R^{14}$ and $R^{15}$ are the same or different and are each independently hydrogen or are represented by Chemical Formula 3,
$R^6$ is a substituent including an ethylenic double bond,
$R^7$, $R^8$, $R^{17}$ and $R^{18}$ are the same or different and are each independently hydrogen, a halogen atom or a substituted or unsubstituted C1 to C20 alkyl group,
$Z^1$ and $Z^{11}$ are the same or different and are each independently a single bond, O, CO, $SO_2$, $CR^9R^{10}$, $SiR^{11}R^{12}$ (wherein $R^9$ to $R^{12}$ are the same or different and are each independently hydrogen or a substituted or unsubstituted C1 to C20 alkyl group) or a linking group represented by one of Chemical Formulae a to k,
$Z^2$ and $Z^{12}$ are the same or different and are each independently an acid dianhydride residual group, and
n1, m1, n2 and m2 are the same or different and are each independently an integer ranging from 0 to 4.

[Chemical Formula 3]

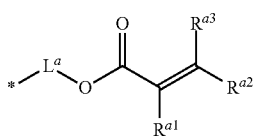

In Chemical Formula 3, $L^a$ is a single bond or a substituted or unsubstituted C1 to C20 alkylene group, and $R^{a1}$ to $R^{a3}$ are the same or different and are each independently hydrogen or a substituted or unsubstituted C1 to C20 alkyl group.

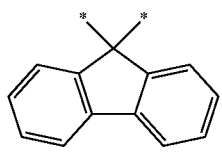

[Chemical Formula a]

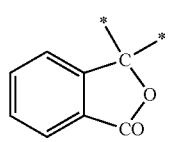

[Chemical Formula b]

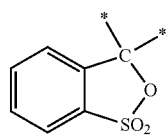

[Chemical Formula c]

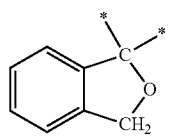

[Chemical Formula d]

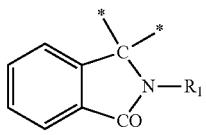

[Chemical Formula e]

In Chemical Formula e, $R_f$ is hydrogen, an ethyl group, $C_2H_4Cl$, $C_2H_4OH$, $CH_2CH=CH_2$ or a phenyl group.

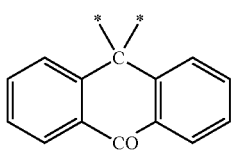

[Chemical Formula f]

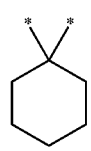

[Chemical Formula g]

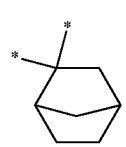

[Chemical Formula h]

[Chemical Formula i]

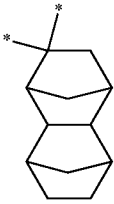

[Chemical Formula j]

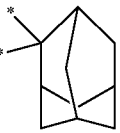

[Chemical Formula k]

$R^6$ may be represented by Chemical Formula 4-1 or Chemical Formula 4-2.

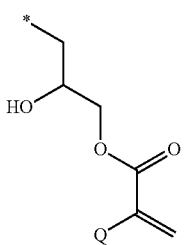

[Chemical Formula 4-1]

In Chemical Formula 4-1,

Q is hydrogen or a substituted or unsubstituted C1 to C20 alkyl group.

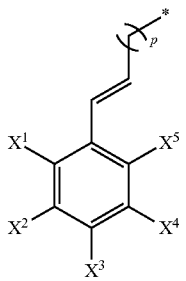

[Chemical Formula 4-2]

In Chemical Formula 4-2, $X^1$ to $X^5$ are the same or different and are each independently hydrogen, a halogen, a substituted or unsubstituted C1 to C20 alkyl group, a substituted or unsubstituted C6 to C30 aryl group, a substituted or unsubstituted amine group or a substituted or unsubstituted C1 to C20 alkoxy group, and p is an integer ranging from 0 to 5.

The cardo-based binder resin may include a terminal end group represented by Chemical Formula 5 at at least one or both terminal ends.

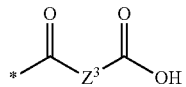

[Chemical Formula 5]

In Chemical Formula 5, $Z^3$ is one of the linking groups represented by Chemical Formulae 6-1 to 6-7.

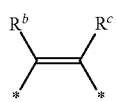

[Chemical Formula 6-1]

In Chemical Formula 6-1, $R^b$ and $R^c$ are the same or different and are each independently hydrogen, a substituted or unsubstituted C1 to C20 alkyl group, an ester group or an ether group.

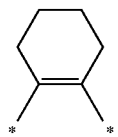

[Chemical Formula 6-2]

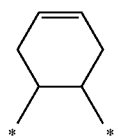

[Chemical Formula 6-3]

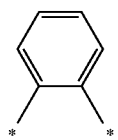

[Chemical Formula 6-4]

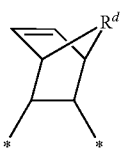

[Chemical Formula 6-5]

In Chemical Formula 6-5, $R^d$ is O, S, NH, a substituted or unsubstituted C1 to C20 alkylene group, C1 to C20 alkylamine group or C2 to C20 alkenylamine group.

[Chemical Formula 6-6]

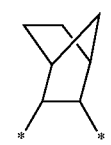

[Chemical Formula 6-7]

The acrylic-based binder resin and the cardo-based binder resin may be included in a weight ratio of about 1:9 to about 9:1.

The repeating unit represented by Chemical Formula 1 may be included in an amount of about 0.05 wt % to about 30 wt % based on the total amount of monomers of the acrylic-based binder resin.

A weight average molecular weight of the acrylic-based binder resin may be about 3,000 g/mol to about 40,000 g/mol.

A weight average molecular weight of the cardo-based binder resin may be about 500 g/mol to about 50,000 g/mol.

The colorant may include a pigment, a dye or a combination thereof.

The initiator may be a photopolymerization initiator, a radical polymerization initiator or a combination thereof.

The photosensitive resin composition may include about 1 wt % to about 30 wt % of the acrylic-based binder resin (A); about 1 wt % to about 30 wt % of the cardo-based binder resin (B); about 0.1 wt % to about 10 wt % of the reactive unsaturated compound (C); about 0.01 wt % to about 10 wt % of the initiator (D); about 10 wt % to about 40 wt % of the colorant (E); and a balance amount of the solvent (F).

The photosensitive resin composition may further include at least one additive selected from malonic acid; 3-amino-1,2-propanediol; a silane-based coupling agent having a vinyl group or a (meth)acryloxy group; a leveling agent; fluorine-based surfactant; and a mixture thereof.

Another embodiment provides a photosensitive resin film manufactured using the photosensitive resin composition.

A pattern in the photosensitive resin film may have a tapered angle of greater than or equal to about 20° and less than about 60°.

Yet another embodiment provides a color filter including the photosensitive resin film.

Other embodiments of the present invention are included in the following detailed description.

The photosensitive resin composition can have improved adherence to a substrate, and thus may be usefully applied to a color filter.

DETAILED DESCRIPTION

Figure 1:
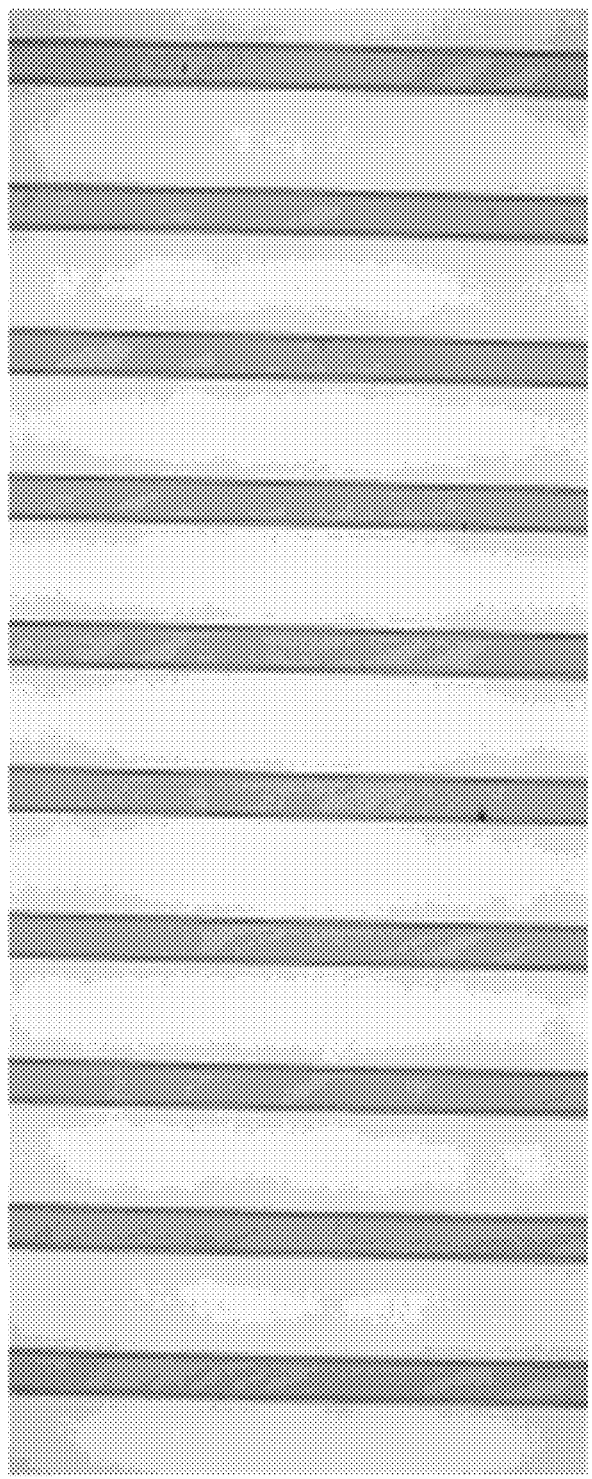
FIGS. 1 and 2 are optical microscope photographs showing a pattern in each photosensitive resin film formed by using the photosensitive resin compositions according to Examples 1 and 2, respectively.

The present invention will be described more fully hereinafter with reference to the accompanying drawings, in which exemplary embodiments of the present invention are shown. This invention may, however, be embodied in many different forms and should not be construed as limited to the exemplary embodiments set forth herein. These exemplary embodiments disclosed in this specification are provided so that this disclosure will satisfy applicable legal requirements.

As used herein, when a specific definition is not otherwise provided, "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C7 to C20 arylalkyl group, the term "alkylene group" refers to a C1 to C20 alkylene group, the term "arylene group" refers to a C6 to C20 arylene group, the term "alkylarylene group" refers to a C7 to C20 alkylarylene group, the term "heteroarylene group" refers to a C3 to C20 heteroarylene group, and the term "alkoxylene group" refers to a C1 to C20 alkoxylene group.

As used herein, when a specific definition is not otherwise provided, "substituted" refers to one substituted with a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a silyl group, a carboxyl group or a salt thereof, a sulfonic acid group or a salt thereof, a phosphoric acid such as phosphonic acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof, instead of at least one hydrogen.

As used herein, when a specific definition is not otherwise provided, the term "hetero" refers to one substituted with at least one hetero atom of N, O, S and/or P, instead of at least one C in a cyclic substituent.

As used herein, when a specific definition is not otherwise provided, "(meth)acrylate" refers to both "acrylate" and "methacrylate," and "(meth)acrylic acid" refers to "acrylic acid" and "methacrylic acid."

As used herein, when a specific definition is not otherwise provided, the term "combination" refers to mixing or copolymerization.

As used herein, unless a specific definition is otherwise provided, a hydrogen atom is bonded at the position when a chemical bond is not drawn where a bond would otherwise appear.

As used herein, when a specific definition is not otherwise provided, the cardo-based resin refers to a resin including at least one of the linking groups represented by Chemical Formula a to Chemical Formula k in a backbone.

As used herein, when a specific definition is not otherwise provided, "*" indicates a point where the same or different atom or chemical formula is linked.

A photosensitive resin composition according to one embodiment includes (A) an acrylic-based binder resin including a repeating unit represented by Chemical Formula 1; (B) a cardo-based binder resin including a repeating unit represented by Chemical Formula 2-1 and a repeating unit represented by Chemical Formula 2-2; (C) a reactive unsaturated compound; (D) an initiator; (E) a colorant; and (F) a solvent. The acrylic-based binder resin includes the repeating unit represented by Chemical Formula 1 and may improve adherence of the photosensitive resin composition to a substrate, and the cardo-based binder resin includes the repeating units represented by Chemical Formulas 2-1 and 2-2 and may improve surface hardness during a curing process, providing a photosensitive resin film that can have a fine pattern having an excellent development margin and maintaining a low tapered angle and a color filter.

Hereinafter, each component is described in detail.

(A) Acrylic-based Binder Resin

The acrylic-based binder resin includes a repeating unit represented by Chemical Formula 1.

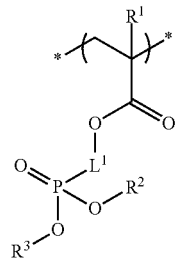

[Chemical Formula 1]

In Chemical Formula 1, $R^1$ is hydrogen or a substituted or unsubstituted C1 to C20 alkyl group, $R^2$ and $R^3$ are the same or different and are each independently hydrogen, a substituted or unsubstituted C1 to C20 alkyl group, a substituted or unsubstituted C3 to C20 cycloalkyl group or a substituted or unsubstituted C6 to C20 aryl group, and $L^1$ is a substituted or unsubstituted C1 to C20 alkylene group.

In general, a photosensitive resin composition can leave a water spot in a pattern formed after the development. Accordingly, an attempt to solve the water spot problem has been made by using an acrylic-based binder resin including a repeating unit represented by Chemical Formula X to increase a contact angle.

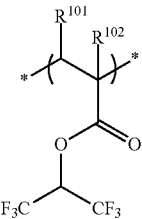

[Chemical Formula X]

In Chemical Formula X, $R^{101}$ and $R^{102}$ are each independently hydrogen or C1 to C20 alkyl group.

However, the acrylic-based binder resin including a repeating unit represented by Chemical Formula X may solve the water spot problem to a degree but can show deteriorated adherence to a substrate and can increase the tapered angle of a pattern beyond necessity.

In contrast, according to one embodiment, the acrylic-based binder resin includes the repeating unit represented by Chemical Formula 1 and thus may minimize generation of a water spot and simultaneously improve adherence to a substrate and resultantly maintain a low tapered angle of a pattern formed after the development.

The repeating unit represented by Chemical Formula 1 may be included in an amount of about 0.05 wt % to about 30 wt %, for example about 1 wt % to about 20 wt %, for example about 5 wt % to about 15 wt %, based on the total amount (total weight, 100 wt %) of monomers of the acrylic-based binder resin. In some embodiments, the acrylic-based binder resin may include the repeating unit represented by Chemical Formula 1 in an amount of about 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the repeating unit represented by Chemical Formula 1 can be in a range from about any of the foregoing amounts to about any other of the foregoing amounts.

When the repeating unit represented by Chemical Formula 1 is present in an amount within the above range based on the total amount of monomers of the acrylic-based binder resin, adherence to a substrate and/or developability may be improved.

The acrylic-based binder resin is a copolymer including (a) the repeating unit represented by Chemical Formula 1, (b) an ethylenic unsaturated monomer including at least one carboxyl group, and (c) another ethylenic unsaturated monomer that is copolymerizable therewith.

For example, the acrylic-based binder resin can be a copolymer including about 0.05 wt % to about 30 wt % of (a) the repeating unit represented by Chemical Formula 1, about 10 wt % to about 30 wt % of (b) ethylenic unsaturated monomer including at least one carboxyl group, and about 60 wt % to about 80 wt % of (c) another ethylenic unsaturated monomer that is copolymerizable with the ethylenic unsaturated monomer including at least one carboxyl group.

Examples of the ethylenic unsaturated monomer having the carboxyl group may include without limitation one or more of acrylic acid, methacrylic acid, maleic acid, itaconic acid, fumaric acid, and the like, and combinations thereof.

Examples of the other ethylenic unsaturated monomer that is copolymerizable with the ethylenic unsaturated monomer including at least one carboxyl group may include without limitation alkenyl aromatic compounds such as styrene, α-methyl styrene, vinyl toluene, and vinyl benzyl methyl ether; unsaturated carbonic acid ester compounds such as methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and tricyclodecane methacrylate; unsaturated carbonic acid amino alkyl ester compounds such as 2-amino ethyl acrylate, N-phenylmaleimide, glycolmethacrylate, polyvalerolactone methacrylate, N-vinylpyrrolidone, 2-amino ethyl methacrylate, 2-dimethyl amino ethyl acrylate, and 2-dimethyl amino ethyl methacrylate; carbonic acid vinyl ester compounds such as vinyl acetate and vinyl benzoate; unsaturated carbonic acid glycidyl ester compounds such as glycidyl acrylate and glycidyl methacrylate; vinyl cyanide compounds such as acrylonitrile and methacrylonitrile; unsaturated amide compounds such as acrylamide and methacrylamide, and the like, and combinations thereof.

The acrylic-based binder resin may have a weight average molecular weight of about 3,000 g/mol to about 40,000 g/mol, for example about 9600 g/mol to about 40,000 g/mol. When the binder resin has a weight average molecular weight within the above range, excellent developability may be obtained.

The photosensitive resin composition may include the acrylic-based binder resin in an amount of about 1 wt % to about 30 wt %, for example, about 1 wt % to about 20 wt %, for example about 1 wt % to about 10 wt %, based on the total amount (total weight, 100 wt %) of the photosensitive resin composition. In some embodiments, the photosensitive resin composition may include the acrylic-based binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the acrylic-based binder resin can be in a range from about any of the foregoing amounts to about any other of the foregoing amounts.

When the acrylic-based binder resin is included in an amount within the above range, developability for alkali developing solution can be improved, surface roughness can decrease due to good cross-linking, and/or a pattern may not be stripped due to good chemical resistance.

(B) Cardo-based Binder Resin

The cardo-based binder resin includes a repeating unit represented by Chemical Formula 2-1 and a repeating unit represented by Chemical Formula 2-2.

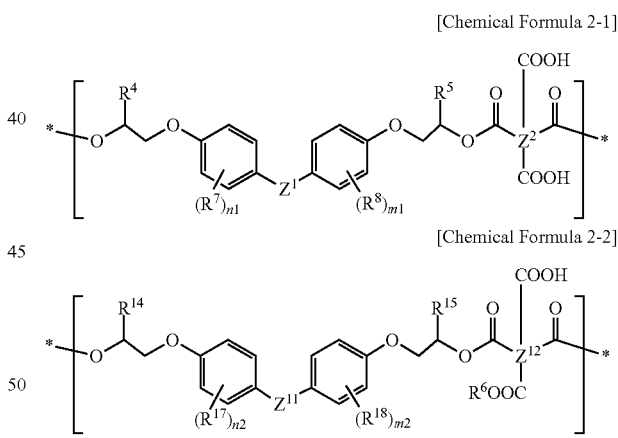

In Chemical Formulae 2-1 and 2-2, $R^4$, $R^5$, $R^{14}$ and $R^{15}$ are the same or different and are each independently hydrogen or are represented by Chemical Formula 3, $R^6$ is a substituent including an ethylenic double bond, $R^7$, $R^8$, $R^{17}$ and $R^{18}$ are the same or different and are each independently hydrogen, a halogen atom or a substituted or unsubstituted C1 to C20 alkyl group, $Z^1$ and $Z^{11}$ are the same or different and are each independently a single bond, O, CO, $SO_2$, $CR^9R^{10}$, $SiR^{11}R^{12}$ (wherein $R^9$ to $R^{12}$ are the same or different and are each independently hydrogen or a substituted or unsubstituted C1 to C20 alkyl group) or a linking group represented by Chemical Formulae a to k, $Z^2$ and $Z^{12}$ are the same or different and are each independently an acid dianhydride residual group, and n1, m1, n2 and m2 are the same or different and are each independently an integer ranging from 0 to 4.

[Chemical Formula 3]

In Chemical Formula 3, $L^a$ is a single bond or a substituted or unsubstituted C1 to C20 alkylene group, $R^{a1}$ to $R^{a3}$ are the same or different and are each independently hydrogen or a substituted or unsubstituted C1 to C20 alkyl group.

[Chemical Formula a]

[Chemical Formula b]

[Chemical Formula c]

[Chemical Formula d]

[Chemical Formula e]

In Chemical Formula e, $R_f$ is hydrogen, an ethyl group, $C_2H_4Cl$, $C_2H_4OH$, $CH_2CH{=}CH_2$ or a phenyl group.

[Chemical Formula f]

[Chemical Formula g]

[Chemical Formula h]

[Chemical Formula i]

[Chemical Formula j]

[Chemical Formula k]

For example, $R^6$ may be represented by Chemical Formula 4-1 or Chemical Formula 4-2.

[Chemical Formula 4-1]

In Chemical Formula 4-1,

Q is hydrogen or a substituted or unsubstituted C1 to C20 alkyl group.

[Chemical Formula 4-2]

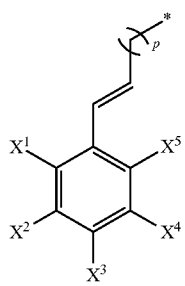

In Chemical Formula 4-2, $X^1$ to $X^5$ are the same or different and are each independently hydrogen, a halogen, a substituted or unsubstituted C1 to C20 alkyl group, a substituted or unsubstituted C6 to C30 aryl group, a substituted or unsubstituted amine group or a substituted or unsubstituted C1 to C20 alkoxy group, and p is an integer ranging from 0 to 5.

The cardo-based binder resin includes the substituent represented by Chemical Formula 4-1 or 4-2 and may improve surface hardness during curing (e.g., photocuring). The reason is that the substituent represented by Chemical Formula 4-1 or 4-2 includes a vinyl group and provides a curing site.

In addition, the cardo-based binder resin includes the substituent represented by Chemical Formula 4-1 or 4-2 and may realize excellent resolution as well as surface hardness.

The cardo-based binder resin may be obtained by reacting a compound represented by Chemical Formula 7 with tetracarboxylic dianhydride.

[Chemical Formula 7]

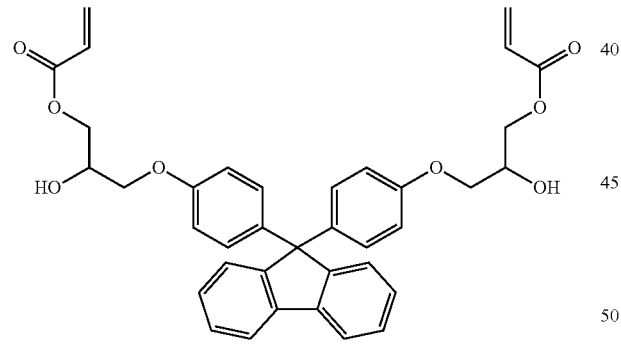

The tetracarboxylic dianhydride may be aromatic tetracarboxylic dianhydride. Examples of the aromatic tetracarboxylic dianhydride may include without limitation pyromellitic dianhydride, 3,3',4,4'-biphenyltetracarboxylic dianhydride, 2,3,3',4-biphenyltetracarboxylic dianhydride, 2,2',3,3'-biphenyltetracarboxylic dianhydride, 3,3',4,4'-benzophenonetetracarboxylic dianhydride, 3,3',4,4'-diphenylethertetracarboxylic dianhydride, 3,3',4,4'-diphenylsulfonetetracarboxylic dianhydride, 1,2,3,4-cyclopentanetetracarboxylic dianhydride, 1,2,5,6-naphthalenetetracarboxylic dianhydride, 2,3,6,7-naphthalenetetracarboxylic dianhydride, 1,4,5,8-naphthalenetetracarboxylic dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, and the like, and combinations thereof.

The cardo-based binder resin may include a terminal end group represented by Chemical Formula 5 at at least one or both terminal ends.

[Chemical Formula 5]

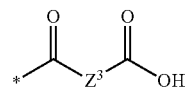

In Chemical Formula 5, $Z^3$ is one of the linking groups represented by Chemical Formulae 6-1 to 6-7.

[Chemical Formula 6-1]

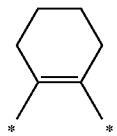

In Chemical Formula 6-1, $R^b$ and $R^c$ are the same or different and are each independently hydrogen, a substituted or unsubstituted C1 to C20 alkyl group, an ester group or an ether group.

[Chemical Formula 6-2]

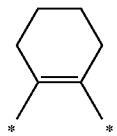

[Chemical Formula 6-3]

[Chemical Formula 6-4]

[Chemical Formula 6-5]

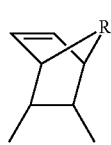

In Chemical Formula 6-5, $R^d$ is O, S, NH, a substituted or unsubstituted C1 to C20 alkylene group, C1 to C20 alkylamine group or C2 to C20 alkenylamine group.

[Chemical Formula 6-6]

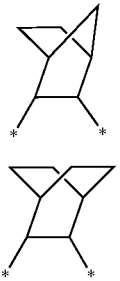

[Chemical Formula 6-7]

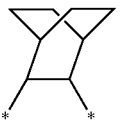

The cardo-based binder resin may have a weight average molecular weight of about 500 g/mol to about 50,000 g/mol, for example about 500 g/mol to about 10,000 g/mol. When the weight average molecular weight of the cardo-based binder resin is within the above range, excellent patterning properties and/or developability may be obtained.

The photosensitive resin composition may include the cardo-based binder resin in an amount of about 1 wt % to about 30 wt %, for example about 1 wt % to about 20 wt %, for example about 1 wt % to about 10 wt %, based on the total amount (total weight, 100 wt %) of the photosensitive resin composition. In some embodiments, the photosensitive resin composition may include the cardo-based binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the cardo-based binder resin can be in a range from about any of the foregoing amounts to about any other of the foregoing amounts.

When the cardo-based binder resin is included in an amount within the above range, patterning properties, processibility and/or developability can be improved.

The acrylic-based binder resin and the cardo-based binder resin may be included in a weight ratio of about 1:9 to about 9:1, for example, about 1:5 to about 5:1, for example about 1:3 to about 3:1

When the cardo-based resin and acrylic-based resin are included in amounts within the above weight ratio range, a fine pattern having a lowered tapered angle as well as maintaining excellent developability and sensitivity may be formed, and an undercut may also be prevented.

(C) Reactive Unsaturated Compound

The reactive unsaturated compound is a generally-used monomer and/or oligomer in a photosensitive resin composition, and may be mono-functional and/or multi-functional ester of (meth)acrylic acid including at least one ethylenic unsaturated double bond.

The reactive unsaturated compound has the ethylenic unsaturated double bond and thus may cause sufficient polymerization during exposure in a pattern-forming process and form a pattern that can have excellent heat resistance, light resistance, and/or chemical resistance.

Examples of the reactive unsaturated compound may include without limitation ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, pentaerythritol tetraacrylate, dipentaerythritol pentaacrylate, dipentaerythritol hexaacrylate, bisphenol A epoxyacrylate, ethylene glycolmonomethylether acrylate, trimethylolpropane triacrylate, trisacryloyloxyethyl phosphate, and the like, and combinations thereof.

Commercially available examples of the reactive unsaturated compound are as follows. Examples of the mono-functional (meth)acrylic acid ester may include without limitation Aronix M-101®, M-111®, and/or M-114® (Toagosei Chemistry Industry Co., Ltd.); KAYARAD TC-110S® and/or TC-120S® (Nippon Kayaku Co., Ltd.); V-158® and/or V-2311® (Osaka Organic Chemical Ind., Ltd.), and the like. Examples of a difunctional (meth)acrylic acid ester may include without limitation Aronix M-210®, M-240®, and/or M-6200® (Toagosei Chemistry Industry Co., Ltd.), KAYARAD HDDA®, HX-220®, and/or R-604® (Nippon Kayaku Co., Ltd.), V-260®, V-312®, and/or V-335 HP® (Osaka Organic Chemical Ind., Ltd.), and the like. Examples of a tri-functional (meth)acrylic acid ester may include without limitation Aronix M-309®, M-400®, M-405®, M-450®, M-7100®, M-8030®, and/or M-8060® (Toagosei Chemistry Industry Co., Ltd.), KAYARAD TMPTA®, DPCA-20®, DPCA-30®, DPCA-60®, and/or DPCA-120® (Nippon Kayaku Co., Ltd.), V-295®, V-300®, V-360®, V-GPT®, V-3PA®, and/or V-400® (Osaka Yuki Kayaku Kogyo Co. Ltd.), and the like. These may be used singularly or as a mixture of two or more.

The reactive unsaturated compound may be treated with acid anhydride to improve developability.

The photosensitive resin composition may include the reactive unsaturated compound in an amount of about 0.1 wt % to about 10 wt %, for example about 0.5 wt % to about 5 wt %, based on the total amount (total weight, 100 wt %) of the photosensitive resin composition. In some embodiments, the photosensitive resin composition may include the reactive unsaturated compound in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the reactive unsaturated compound can be in a range from about any of the foregoing amounts to about any other of the foregoing amounts.

When the reactive unsaturated compound is included in an amount within the above range, the reactive unsaturated compound can be sufficiently cured during exposure in a pattern-forming process and can have excellent reliability, heat resistance, light resistance and/or chemical resistance of a pattern can be improved, and resolution and adherence to a substrate can be improved.

(D) Initiator

The initiator may be a photopolymerization initiator, a radical polymerization initiator, or a combination thereof.

The photopolymerization initiator is a generally-used initiator in a photosensitive resin composition, and may be for example an acetophenone-based compound, a benzophenone-based compound, a thioxanthone-based compound, a benzoin-based compound, an oxime-based compound, or a combination thereof.

Examples of the acetophenone-based compound may include without limitation 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like, and combinations thereof.

Examples of the oxime-based compound may include without limitation an O-acyloxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one and the like, and combinations thereof. Examples of the O-acyloxime-based compound may include without limitation 1,2-octandione, 2-dimethylamino-2-(4-methylbenzyl)-1-(4-morpholin-4-yl-phenyl)-butan-1-one, 1-(4-phenylsulfanyl phenyl)butane-1,2-dione2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate, 1-(4-phenylsulfanyl phenyl)-butan-1-oneoxime-O-acetate and the like, and combinations thereof.

The photopolymerization initiator may further include one or more of a carbazole-based compound, a diketone-based compound, a sulfonium borate-based compound, a diazo-based compound, an imidazole-based compound, a biimidazole-based compound, and the like, in addition to or instead of one or more of the above compounds.

The radical polymerization initiator may be a peroxide-based compound and/or an azobis-based compound.

Examples of the peroxide-based compound may include without limitation ketone peroxides such as methylethylketone peroxide, methylisobutylketone peroxide, cyclohexanone peroxide, methylcyclohexanone peroxide, and acetylacetone peroxide; diacyl peroxides such as isobutyryl peroxide, 2,4-dichlorobenzoyl peroxide, o-methylbenzoyl peroxide, and bis-3,5,5-trimethylhexanoyl peroxide; hydro peroxides such as 2,4,4,-trimethylpentyl-2-hydro peroxide, diisopropylbenzenehydro peroxide, cumenehydro peroxide, and t-butylhydro peroxide; dialkyl peroxides such as dicumyl peroxide, 2,5-dimethyl-2,5-di(t-butylperoxy) hexane, 1,3-bis(t-butyloxyisopropyl)benzene, and t-butylperoxyvaleric acid n-butylester; alkyl peresters such as 2,4,4-trimethylpentyl peroxyphenoxyacetate, α-cumyl peroxyneodecanoate, t-butyl peroxybenzoate, and di-t-butyl peroxytrimethyladipate; and percarbonates such as di-3-methoxybutyl peroxydicarbonate, di-2-ethylhexyl peroxydicarbonate, bis-4-t-butylcyclohexyl peroxydicarbonate, diisopropyl peroxydicarbonate, acetylcyclohexylsulfonyl peroxide, and t-butyl peroxyarylcarbonate. These may be used singularly or as a mixture of two or more.

Examples of the azobis-based compound may include without limitation 1,1'-azobiscyclohexane-1-carbonitrile, 2,2'-azobis(2,4-dimethylvaleronitrile), 2,2,-azobis(methylisobutyrate), 2,2'-azobis(4-methoxy-2,4-dimethylvaleronitrile), α,α'-azobis(isobutylnitrile), 4,4'-azobis(4-cyanovaleric acid), and the like. These may be used singularly or as a mixture of two or more.

The initiator may be used with a photosensitizer capable of causing a chemical reaction by absorbing light and becoming excited and then transferring its energy.

Examples of the photosensitizer may include without limitation tetraethylene glycol bis-3-mercapto propionate, pentaerythritol tetrakis-3-mercapto propionate, dipentaerythritol tetrakis-3-mercapto propionate, and the like, and combinations thereof.

The photosensitive resin composition may include the initiator in an amount of about 0.01 to about 10 wt %, for example about 0.1 to about 5 wt %, based on the total amount (total weight, 100 wt %) of the photosensitive resin composition. In some embodiments, the photosensitive resin composition may include the initiator in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the initiator can be in a range from about any of the foregoing amounts to about any other of the foregoing amounts.

When the initiator is included in an amount within the above range, excellent reliability may be secured due to sufficiently curing during exposure in a pattern-forming process, a pattern may have excellent resolution and close contacting (adhesive) property as well as excellent heat resistance, light resistance, and chemical resistance, and transmittance may be prevented from deterioration due to a non-reaction initiator.

(E) Colorant

The colorant may be a pigment, a dye or a combination thereof, and the pigment may include an organic pigment and/or an inorganic pigment.

The pigment may be a red pigment, a green pigment, a blue pigment, a yellow pigment, a black pigment or a combination thereof.

Examples of the red pigment may include without limitation C.I. red pigment 254, C.I. red pigment 255, C.I. red pigment 264, C.I. red pigment 270, C.I. red pigment 272, C.I. red pigment 177, C.I. red pigment 89, and the like. Examples of the green pigment may include without limitation C.I. green pigment 58, C.I. green pigment 36, C.I. green pigment 7, and the like. Examples of the blue pigment may include without limitation a copper phthalocyanine pigment such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, and C.I. blue pigment 16. Examples of the yellow pigment may include without limitation an isoindoline-based pigment such as C.I. yellow pigment 139, a quinophthalone-based pigment such as C.I. yellow pigment 138, a nickel complex pigment such as C.I. yellow pigment 150. Examples of the black pigment may include without limitation aniline black, perylene black, titanium black, carbon black, and the like. The pigment may be used singularly or as a mixture of two or more, but is not limited thereto.

The photosensitive resin composition may further include a dispersing agent in order to improve dispersion of the pigment. The pigment may be surface-pretreated with a dispersing agent, or the pigment and dispersing agent may be added together during preparation of the photosensitive resin composition. That is, the colorant in the photosensitive resin composition may be a pigment dispersion (a solvent including a pigment and a dispersing agent, and the solvent can be the same as described later).

The dispersing agent may be a non-ionic dispersing agent, an anionic dispersing agent, a cationic dispersing agent, and the like. Examples of the dispersing agent may include without limitation polyalkylene glycol and esters thereof, polyoxyalkylene, polyhydric alcohol ester alkylene oxide addition products, alcohol alkylene oxide addition products, sulfonate esters, sulfonate salts, carboxylate esters, carboxylate salts, alkylamide alkylene oxide addition products, alkyl amines, and the like, and may be used singularly or as a mixture of two or more.

Commercially available examples of the dispersing agent may include without limitation DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; and/or PB711, PB821, and the like made by Ajinomoto Inc. These may be used singularly or as a mixture of two or more.

The photosensitive resin composition may include the dispersing agent in an amount of about 0.1 to about 15 wt % based on the total weight (100 wt %) of the photosensitive resin composition. When the dispersing agent is included in an amount within the above range, the photosensitive resin composition can have excellent dispersion property and thus, may form a light blocking layer having excellent stability, developability, and/or pattern-forming capability.

The pigment may be pre-treated using a water-soluble inorganic salt and a wetting agent. When the pigment is pre-treated, a primary particle of the pigment may become finer.

The pre-treatment may be performed by kneading the pigment with a water-soluble inorganic salt and a wetting agent and then filtering and washing the knead pigment.

The kneading may be performed at a temperature ranging from about 40° C. to about 100° C., and the filtering and washing may be performed by filtering the pigment after washing away an inorganic salt with water and the like.

Examples of the water-soluble inorganic salt may include without limitation sodium chloride, potassium chloride, and the like, and combinations thereof.

The wetting agent may help the pigment to be uniformly mixed with the water-soluble inorganic salt and be pulverized. Examples of the wetting agent include without limitation alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used singularly or as a mixture of two or more.

The pigment after the kneading may have an average particle diameter ranging from about 30 nm to about 100 nm. When the pigment has an average particle diameter within the above range, a fine pattern having excellent heat resistance and/or light resistance may be effectively formed.

The photosensitive resin composition may include the colorant, for example a pigment dispersion, in an amount of about 10 to about 40 wt % for example, about 15 to about 40 wt %, based on the total amount (total weight, 100 wt %) of the photosensitive resin composition. In some embodiments, the photosensitive resin composition may include the colorant in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the colorant can be in a range from about any of the foregoing amounts to about any other of the foregoing amounts.

When the pigment is included in an amount within the above range, a pattern having excellent color reproducibility, curing property, and/or close contacting (adhesive) property may be obtained.

(F) Solvent

The solvent is a material having compatibility with the acrylic-based binder resin, the cardo-based binder resin, the reactive unsaturated compound, the initiator and the colorant, but not reacting therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate, and the like; monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; and ketonate esters such as ethyl pyruvate, and the like. Additionally, high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, y-butyrolactone, ethylene carbonate, propylene carbonate, phenyl cellosolve acetate, and the like may be also used. The solvents may be used singularly or as a mixture of two or more.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; and/or propylene glycol alkylether acetates such as propylene glycol monomethylether acetate, propylene glycol propylether acetate and the like may be used.

The photosensitive resin composition may include the solvent in a balance amount, for example about 10 to about 80 wt %, based on the total amount (total weight, 100 wt %) of the photosensitive resin composition. In some embodiments, the photosensitive resin composition may include the solvent in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %. Further, according to some embodiments of the present invention, the amount of the solvent can be in a range from about any of the foregoing amounts to about any other of the foregoing amounts.

When the solvent is included in an amount within the above range, the photosensitive resin composition may have an appropriate viscosity, which can improve coating characteristics.

(G) Other Additive(s)

The photosensitive resin composition may further include one or more other additives such as malonic acid; 3-amino-1,2-propanediol; a coupling agent including a vinyl group or a (meth)acryloxy group; a leveling agent; a surfactant; a radical polymerization initiator; and the like, and combinations thereof, in order to prevent stains or spots during the coating, to adjust leveling, and/or to prevent pattern residue due to non-development. The amount of the additive may be controlled depending on desired properties.

Examples of the silane-based coupling agent may include without limitation vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like, and combinations thereof. The silane-based coupling agent may be included in an amount of about 0.01 to about 2 wt % based on the total amount (total weight, 100 wt %) of the photosensitive resin composition for a color filter. When the silane-based coupling agent is included in an amount within the above range, adherence, storage stability and/or coating properties may be improved.

The fluorine-based surfactant may be a surfactant having a fluorocarbon backbone, and the like. Examples of the fluorine-based surfactant may include without limitation FULORAD FC430 and/or FULORAD FC431 of SUMITOMO 3M CO., LTD.; MEGAFACE F142D, MEGAFACE F171, MEGAFACE F172, MEGAFACE F173, MEGAFACE F177, MEGAFACE F183, MEGAFACE F470, MEGAFACE F475, and/or MEGAFACE R30 of DAINIPPON INK KAGAKU KOGYO CO., LTD.; EFTOP EF301, EFTOP EF303, EFTOP EF351, and/or EFTOP EF352 of TOCHEM RODUCTS, CO., LTD.; SURFLON S381, SURFLON S382, SURFLON SC101, and/or SURFLON SC105 of ASAHI GLASS CO., LTD.; E5844 of DIKIN Finechemical Laboratory; and the like, and combinations thereof.

Furthermore, the photosensitive resin composition may include one or more other additives such as an antioxidant, a stabilizer, and the like, and combinations thereof, in a predetermined amount unless they deteriorate properties of the photosensitive resin composition.

According to another embodiment, a photosensitive resin film manufactured using the photosensitive resin composition is provided. The photosensitive resin film may be manufactured as follows.

(1) Application and Film Formation

The photosensitive resin composition can be coated to have a desired thickness, for example, a thickness ranging from about 0.5 µm to about 25 µm, on a substrate which undergoes a predetermined pretreatment, using a spin or slit coating method, a roll coating method, a screen-printing method, an applicator method, and the like. Then, the coated substrate can be heated at a temperature ranging from about 70° C. to about 110° C. for about 1 minute to about 10 minutes to remove a solvent.

(2) Exposure

The resultant film can be radiated by an active ray of about 190 nm to about 500 nm after putting a mask with a predetermined shape to form a desired pattern.

The radiation can be performed by using a light source such as a mercury lamp with a low pressure, a high pressure, or an ultra high pressure, a metal halide lamp, an argon gas laser, and the like. An X ray, an electron beam, and the like may be also used depending on a case.

An exemplary exposure process can use, for example, a light dose of about 500 mJ/cm$^2$ or less (with a 365 nm sensor) when a high pressure mercury lamp is used. However, the light dose may vary depending on kinds of each component of the photosensitive resin composition, its combination ratio, and a dry film thickness.

(3) Development

After the exposure process, an alkali aqueous solution can be used to develop the exposed film by dissolving and removing an unnecessary part except the exposed part, forming an image pattern.

(4) Post-treatment

The developed image pattern may be heated again or radiated by an active ray and the like for curing, in order to accomplish excellent quality in terms of heat resistance, photo resistance, close contacting properties, crack-resistance, chemical resistance, high strength, storage stability, and the like.

A photosensitive resin film formed by using the above photosensitive resin composition may show a stable tapered angle of a pattern in a range of greater than or equal to about 20° to less than about 60°, for example, greater than or equal to about 30° to less than 60° depending on an exposure dose and also can have high surface sensitivity during the UV exposure and thus prevent generation of a water spot and realize a fine pattern.

For example, when a development pressure and a wash pressure are greater than or equal to about 1.5 kgf, the end of a pattern is broken apart and forms a high tapered angle of greater than or equal to about 60°, but the photosensitive resin film may maintain a tapered angle of less than about 60° under the development pressure and the wash pressure of greater than or equal to about 1.5 kgf.

The reason is that the acrylic-based binder resin including the repeating unit represented by Chemical Formula 1 can improve adherence to a substrate, and the cardo-based binder resin including the repeating units represented by Chemical Formulas 2-1 and 2-2 can provide excellent surface hardness.

Hereinafter, the present invention is illustrated in more detail with reference to the following examples. These examples, however, are not in any sense to be interpreted as limiting the scope of the invention.

(Preparation of Acryl-based Binder Resin)

PREPARATION EXAMPLE 1

An acrylic-based binder resin having a weight average molecular weight of 9,700 g/mol is prepared with a composition provided in the following Table 1.

COMPARATIVE PREPARATION EXAMPLE 1

An acrylic-based binder resin having a weight average molecular weight of 9,500 g/mol is prepared with a composition provided in the following Table 1.

TABLE 1

(unit: wt %)

| | Comparative Preparation Example 1 | Preparation Example 1 |
|---|---|---|
| Phosphate-based monomer | — | 10 |
| Methylmethacrylate | 50 | 40 |
| Methacrylic acid | 20 | 20 |
| Tricyclodecane methacrylate | 10 | 10 |
| Benzyl methacrylate | 20 | 20 |
| Molecular weight (Mw, g/mol) | 9500 | 9700 |

(In Table 1, the phosphate-based monomer is represented by Chemical Formula Y.

[Chemical Formula Y]

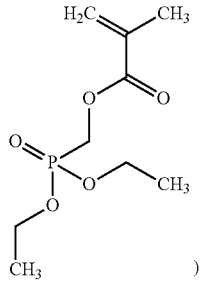

(Preparation of Cardo-based Binder Resin)

PREPARATION EXAMPLE 2

(1) A compound represented by Chemical Formula 7 is synthesized by putting 138 g of 9,9'-bis(4-glycidoxy phenyl)fluorene (manufactured by Hear Chem), 54 g of acrylic acid, 1.4 g of benzyltriethylammoniumchloride (Daejung Chemicals & Metals Co., Ltd.), 1 g of triphenylphosphine (Sigma-Aldrich Co. Ltd.), 128 g of propylglycolmethylethylacetate (Daicel Chemical Corp.) and 0.5 g of hydroquinone in a reactor, heating the reactor up to 120° C. and maintaining it for 12 hours.

[Chemical Formula 7]

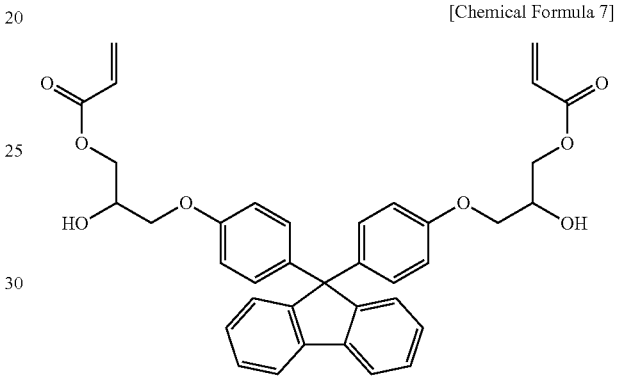

(2) A compound represented by Chemical Formula 8 is synthesized by putting 60 g of the compound represented by Chemical Formula 7, 11 g of biphenyltetracarboxylic dianhydride (Mitsubishi Gas Chemical Company, Inc.), 3 g of tetrahydrophthalic anhydride (Sigma-Aldrich Co. Ltd.), 20 g of propylglycolmethylethylacetate (Daicel Chemical Corp.) and 0.1 g of N,N'-tetramethylammonium chlorite in a reactor, heating the reactor up to 120° C. and maintaining it for 2 hours. The compound represented by Chemical Formula 8 has a weight average molecular weight of 5,400 g/mol.

[Chemical Formula 8]

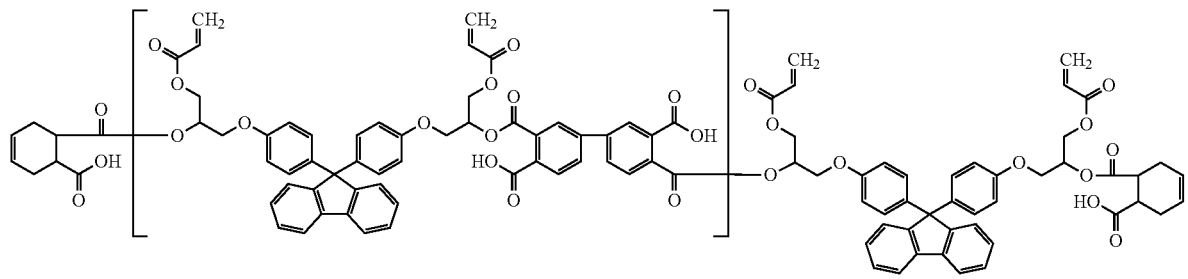

(3) A compound represented by Chemical Formula 9 is synthesized by putting 75 g of the compound represented by Chemical Formula 8, 10 g of glycidyl methacrylate and 0.4 g of triphenylphosphine (Sigma-Aldrich Co. Ltd.) in a reactor, heating the reactor up to 100° C. and maintaining it for 3 hours. The compound represented by Chemical Formula 9 has a weight average molecular weight of 5,600 g/mol.

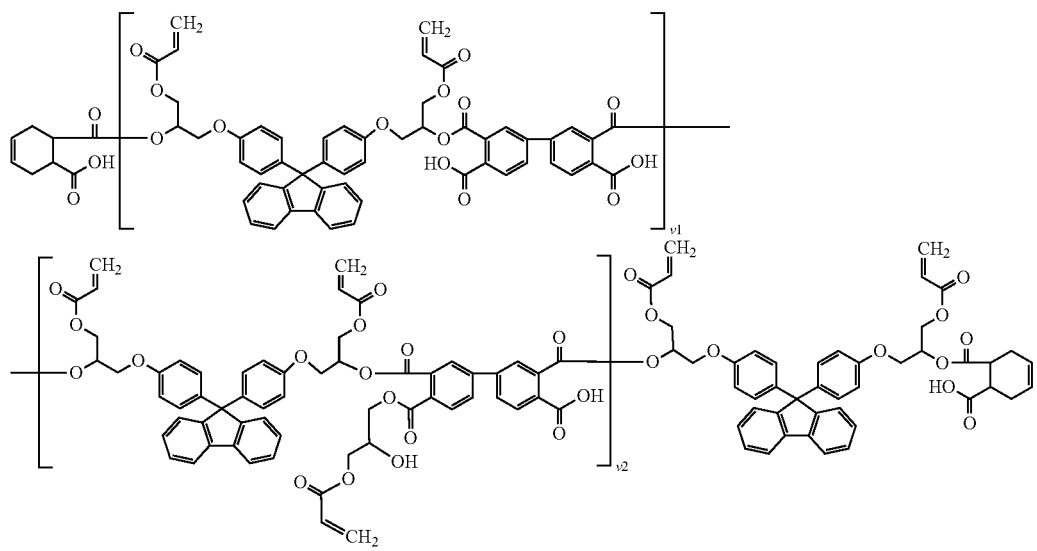

[Chemical Formula 9]

In Chemical Formula 9, v1:v2 is 60:40.

(Preparation of Photosensitive Resin Composition)

EXAMPLES 1 AND 2 AND COMPARATIVE EXAMPLES 1 AND 2

The photosensitive resin compositions according to Examples 1 and 2 and Comparative Examples 1 and 2 are prepared by using the following components with each composition provided in the following Table 2.

Specifically, an initiator is dissolved in a solvent, the solution is agitated at room temperature for 2 hours, a binder resin and a reactive unsaturated compound are added thereto, and the mixture is agitated at room temperature for 2 hours. Then, a colorant and a silane coupling agent are added to the obtained reactant, and the obtained mixture is agitated at room temperature for 1 hour. Subsequently, a product obtained therefrom is three times filtered to remove impurities, preparing a photosensitive resin composition.

(A) Acrylic-based binder resin
(A-1) Acrylic-based binder resin of Preparation Example 1
(A-2) Acrylic-based binder resin of Comparative Preparation Example 1
(B) Cardo-based binder resin
(B-1) Cardo-based binder resin of Preparation Example 2
(C) Reactive unsaturated compound
(C-1) dipentaerythritol hexaacrylate (DPHA, Nippon Kayaku Co., Ltd.)
(C-2) ABPE-20 (KOWA CHEMICALS)
(D) Initiator
(D-1) IGACURE OXE02 (BASF Co.)
(D-2) IGACURE 369 (BASF Co.)
(E) Colorant: pigment dispersion
(E-1) G58 pigment dispersion (self dispersion, DIC Co., Ltd.)
(E-2) Y138 pigment dispersion (self dispersion, King Chemicals Co.)
(F) Solvent
(F-1) propylene glycol monomethyl ether acetate (PGMEA)
(F-2) ethylethoxypropionate (EEP)
(G) additive
(G-1) F-554 (fluorine-based surfactant, DIC Co., Ltd.)
(G-2) S-510 (silane-based coupling agent, CHISSO Co.)

TABLE 2

(unit: wt %)

| | | Example 1 | Example 2 | Comparative Example 1 | Comparative Example 2 |
|---|---|---|---|---|---|
| (A) acrylic-based binder resin | A-1 | 1.068 | 2.068 | 3.560 | — |
| | A-2 | — | — | — | 1.068 |
| (B) cardo-based binder resin | B-1 | 2.492 | 1.492 | — | 2.492 |
| (C) reactive unsaturated compound | C-1 | 2.994 | 2.994 | 2.994 | 2.994 |
| | C-2 | 0.564 | 0.564 | 0.564 | 0.564 |
| (D) initiator | D-1 | 0.723 | 0.723 | 0.723 | 0.723 |
| | D-2 | 0.013 | 0.013 | 0.013 | 0.013 |
| (E) colorant | E-1 | 24.625 | 24.625 | 24.625 | 24.625 |
| | E-2 | 18.398 | 18.398 | 18.398 | 18.398 |
| (F) solvent | F-1 | 36.217 | 36.217 | 36.217 | 36.217 |
| | F-2 | 12.705 | 12.705 | 12.705 | 12.705 |
| (G) additive | G-1 | 0.1 | 0.1 | 0.1 | 0.1 |
| | G-2 | 0.1 | 0.1 | 0.1 | 0.1 |
| Total | | 100 | 100 | 100 | 100 |

Evaluation 1: BT Evaluation

The photosensitive resin compositions according to Examples 1 and 2 and Comparative Examples 1 and 2, respectively, are coated on a silicon wafer (LG Siltron) to be 0.8 μm high by using a spin coater (K-Spin8, KDNS) and exposed for 350 ms by using an exposer (I10C, Nikon Co.).

Subsequently, when developed with a 0.2 wt % tetramethylammonium hydroxide (TMAH) aqueous solution by using a developer (SSP-200, SVS), the amount of time required until a non-exposed region is all washed away (BT) is measured, and the result is provided in the following Table 3.

Referring to Table 3, the photosensitive resin compositions according to Examples 1 and 2 show shorter BT and do not need a long developing time and thus are much more economical compared with the photosensitive resin compositions according to Comparative Examples 1 and 2.

Evaluation 2: Water Spot Evaluation

The photosensitive resin compositions according to Examples 1 and 2 and Comparative Examples 1 and 2, respectively, are coated to be 0.8 μm high on a silicon wafer (LG Siltron) with a spin coater (K-Spin8, KDNS) and then exposed for 350 ms by using an exposer (I10C, Nikon Co.). Subsequently, after developed with a 0.2 wt % tetramethylammonium hydroxide (TMAH) aqueous solution by using a developer (SSP-200, SVS) to form a pattern, an optical microscope is used to evaluate whether a water spot is generated or not in the pattern, and the results are provided in the following Table 3 and FIGS. 1 to 4.

Figure 2:
Figure 3:
FIG. 3 and FIG. 4 are optical microscope photographs showing a pattern in each photosensitive resin film formed by using the photosensitive resin compositions according to Comparative Examples 1 and 2, respectively.
Figure 4:

FIGS. 1 and 2 are optical microscope photographs showing whether a water spot in each pattern formed by using the photosensitive resin compositions according to Examples 1 and 2, respectively, is generated or not, and FIGS. 3 and 4 are optical microscope photographs showing whether a water spot in each pattern formed by using the photosensitive resin compositions according to Comparative Examples 1 and 2, respectively, is generated or not.

<Reference for Judging Generation of Water Spot> x: no water spot

Δ: some water spots

◯: many water spots

Referring to FIGS. 1 to 4, the patterns in the photosensitive resin films formed by using the photosensitive resin compositions according to Examples 1 and 2, respectively, show no water spot, while the patterns in the photosensitive resin films formed by using the photosensitive resin compositions according to Comparative Examples 1 and 2, respectively, show a water spot.

Evaluation 3: CD Evaluation

The photosensitive resin compositions according to Examples 1 and 2 and Comparative Examples 1 and 2, respectively, are coated to be 0.8 μm high on a silicon wafer (LG Siltron) by using a spin coater (K-Spin8, KDNS) and exposed for 350 ms (30 mJ or 50 mJ) by using an exposer (I10C, Nikon Co.). Subsequently, after developed with a 0.2 wt % tetramethylammonium hydroxide (TMAH) aqueous solution by using a developer (SSP-200, SVS) to form a pattern, CD (critical dimension) of the pattern is measured by using a noncontact-type thickness meter (a 3-D profiler), and the results are provided in the following Table 3.

Evaluation 4: Tapered Angle Evaluation

The photosensitive resin compositions according to Examples 1 and 2 and Comparative Examples 1 and 2, respectively, are coated to be 0.8 μm high on a silicon wafer (LG Siltron) by using a spin coater (K-Spin8, KDNS) and exposed (50 mJ) for 350 ms with an exposer (I10C, Nikon Co.). Subsequently, after developed with a 0.2 wt % tetramethylammonium hydroxide (TMAH) aqueous solution by using a developer (SSP-200, SVS) to form a pattern, the tapered angle of the pattern is measured by using a scanning electron microscope, and the results are provided in the following Table 3 and FIGS. 5 to 8.

Figure 5:
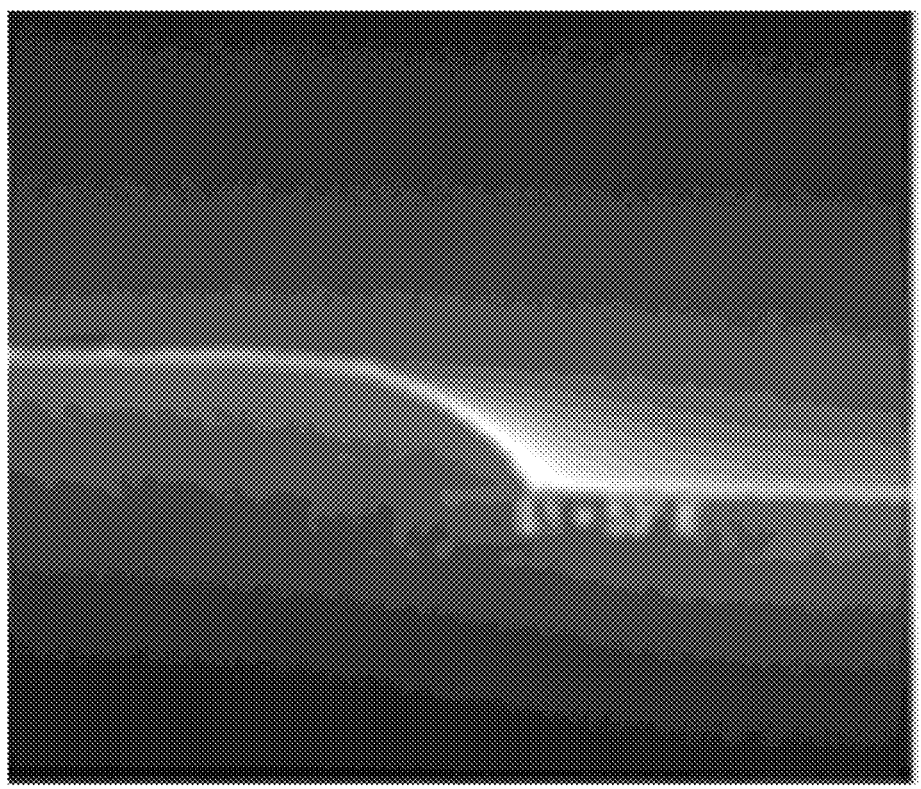
FIG. 5 and FIG. 6 are scanning electron microscopes showing the cross section of the patterns in the photosensitive resin films formed by using the photosensitive resin compositions according to Examples 1 and 2, respectively.
Figure 6:
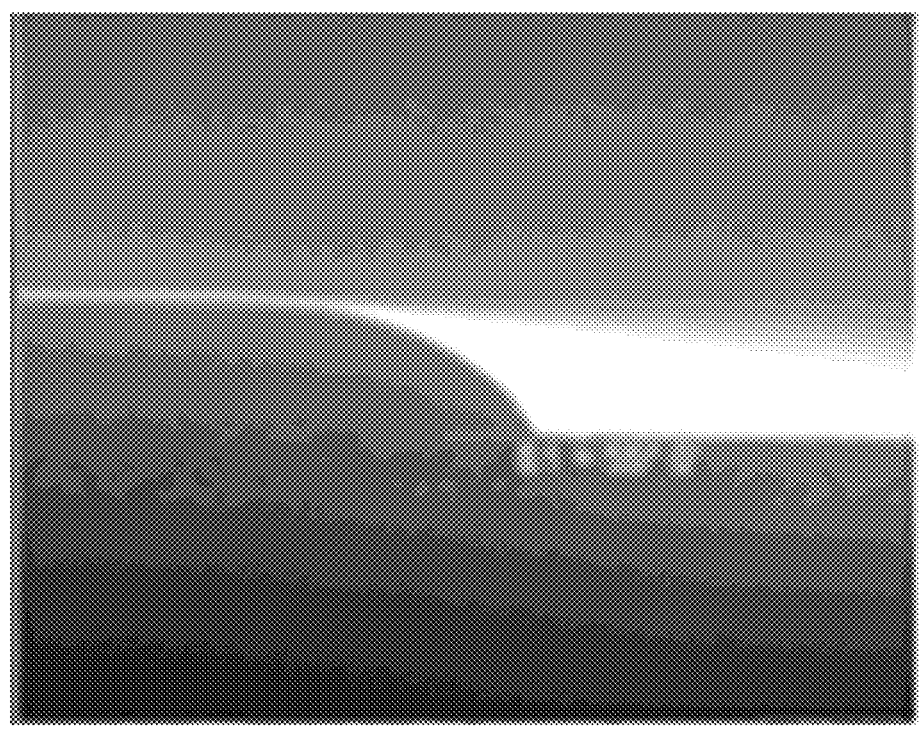
Figure 7:
FIGS. 7 and 8 are scanning electron microscopes showing the cross section of the patterns in the photosensitive resin films formed by using the photosensitive resin compositions according to Comparative Examples 1 and 2, respectively.
Figure 8:
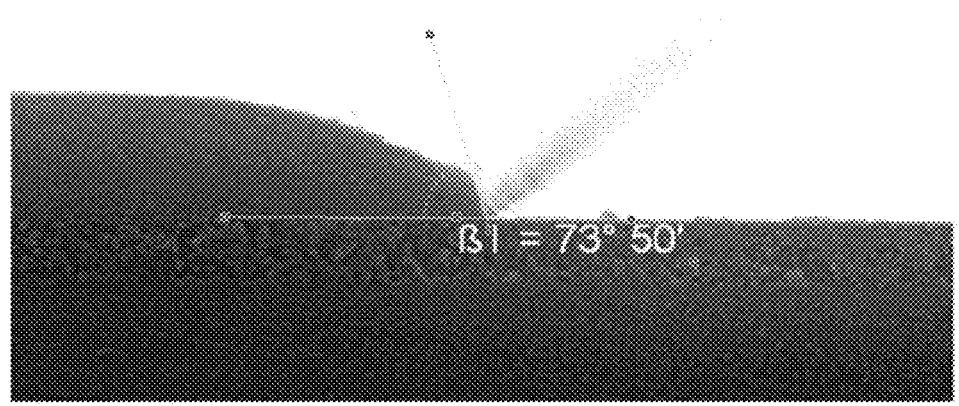

FIGS. 5 and 6 are scanning electron microscope photographs showing the cross section of the patterns in the photosensitive resin film formed by using the photosensitive resin compositions according to Examples 1 and 2, respectively, and FIGS. 7 and 8 are scanning electron microscope photographs showing the cross section of the patterns in the photosensitive resin film formed by using the photosensitive resin compositions according to Comparative Examples 1 and 2, respectively.

Referring to FIGS. 5 to 8, the patterns in the photosensitive resin films formed by using the photosensitive resin compositions according to Examples 1 and 2 show a tapered angle in a range of greater than or equal to 20° to less than 60°, which is smaller than the tapered angles of the patterns in the photosensitive resin films formed by using the photosensitive resin compositions according to Comparative Examples 1 and 2.

TABLE 3

|  | Example 1 | Example 2 | Comparative Example 1 | Comparative Example 2 |
| --- | --- | --- | --- | --- |
| BT (sec) | 21 | 20 | 23 | 22 |
| Generation of water spot | X | X | ◯ | ◯ |
| CD (μm) | 104 | 104 | 101 | 100 |
| tapered angle (°) | 54 | 55 | 79 | 73 |

Referring to Table 3, the photosensitive resin compositions according to Examples 1 and 2 show a tapered angle of less than 60° and no water spot and realized a fine line width compared with the photosensitive resin compositions according to Comparative Examples 1 and 2.

Many modifications and other embodiments of the invention will come to to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition, comprising:
(A) an acrylic-based binder resin including (a) a repeating unit represented by Chemical Formula 1 in an amount of about 5 wt % to about 20 wt % based on the total amount of monomers of the acrylic-based binder resin, (b) an ethylenic unsaturated monomer including at least one carboxyl group in an amount of about 20 wt % to about 30 wt % based on the total amount of monomers of the acrylic-based binder resin and (c) another ethylenic unsaturated monomer that is copolymerizable with the ethylenic unsaturated monomer including at least one carboxyl group in an amount of about 60 wt % to about 70 wt % based on the total amount of monomers of the acrylic-based binder resin;
(B) a cardo-based binder resin including a repeating unit represented by Chemical Formula 2-1 and a repeating unit represented by Chemical Formula 2-2;
(C) a reactive unsaturated compound;
(D) an initiator;
(E) a colorant; and
(F) a solvent;

[Chemical Formula 1]

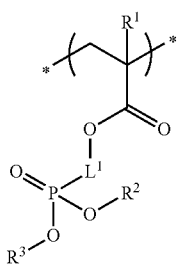

[Chemical Formula 2-1]

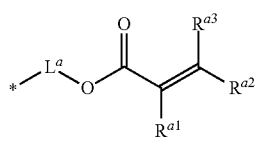

[Chemical Formula 2-2]

wherein, in Chemical Formula 1,
R$^1$ is hydrogen or a substituted or unsubstituted C$_1$ to C$_{20}$
  C$_1$ to C$_{20}$ alkyl group,
R$^2$ and R$^3$ are the same or different and are each independently hydrogen, a substituted or unsubstituted C$_1$ to C$_{20}$ alkyl group, a substituted or unsubstituted C$_3$ to C$_{20}$ cycloalkyl group or a substituted or unsubstituted C$_6$ to C$_{20}$ aryl group,
L$^1$ is a substituted or unsubstituted C$_1$ to C$_{20}$ alkylene group,
in Chemical Formula 2-1 and 2-2,
R$^4$, R$^5$, R$^{14}$ and R$^{15}$ are the same or different and are each independently hydrogen or Chemical Formula 3,
R$^6$ is a substituent including an ethylenic double bond,
R$^7$, R$^8$, R$^{17}$ and R$^{18}$ are the same or different and are each independently hydrogen, a halogen atom or a substituted or unsubstituted C$_1$ to C$_{20}$ alkyl group,
Z$^1$ and Z$^{11}$ are the same or different and are each independently a single bond, O, CO, SO$_2$, CR$^9$R$^{10}$, SiR$^{11}$R$^{12}$, wherein R$^9$ to R$^{12}$ are the same or different and are each independently hydrogen or a substituted or unsubstituted C$_1$ to C$_{20}$ alkyl group, or a linking group represented by Chemical Formulae a to k,
Z$^2$ and Z$^{12}$ are the same or different and are each independently an acid dianhydride residual group, and
n1, m1, n2 and m2 are the same or different and are each independently an integer ranging from 0 to 4,

[Chemical Formula 3]

L$^a$ is a single bond or a substituted or unsubstituted C$_1$ to C$_{20}$ alkylene group, and
R$^{a1}$ to R$^{a3}$ are the same or different and are each independently hydrogen or a substituted or unsubstituted C$_1$ to C$_{20}$ alkyl group,

[Chemical Formula a]

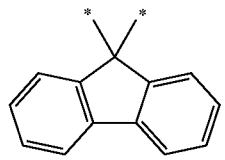

[Chemical Formula b]

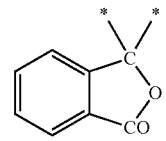

[Chemical Formula c]

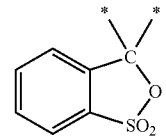

[Chemical Formula d]

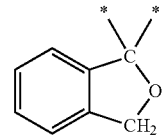

[Chemical Formula e]

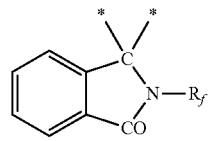

wherein in Chemical Formula e,
R$_f$ is hydrogen, an ethyl group, C$_2$H$_4$Cl, C$_2$H$_4$OH, CH$_2$CH=CH$_2$ or a phenyl group,

[Chemical Formula f]

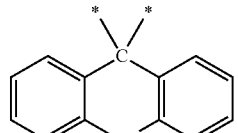

[Chemical Formula g]

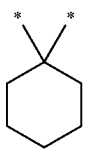

[Chemical Formula h]

wherein, in Chemical Formula 3,

-continued

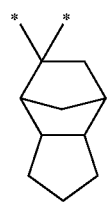

[Chemical Formula i]

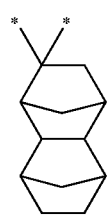

[Chemical Formula j]

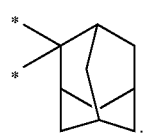

[Chemical Formula k]

2. The photosensitive resin composition of claim 1, wherein the $R^6$ is represented by Chemical Formula 4-1 or Chemical Formula 4-2:

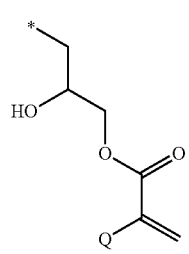

[Chemical Formula 4-1]

wherein, in Chemical Formula 4-1,
Q is hydrogen or a substituted or unsubstituted $C_1$ to $C_{20}$ alkyl group,

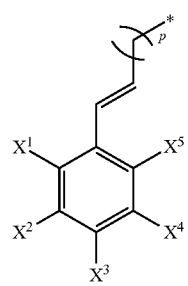

[Chemical Formula 4-2]

wherein, in Chemical Formula 4-2,
$X^1$ to $X^5$ are the same or different and are each independently hydrogen, a halogen, a substituted or unsubstituted $C_1$ to $C_{20}$ alkyl group, a substituted or unsubstituted $C_6$ to $C_{30}$ aryl group, a substituted or unsubstituted amine group or a substituted or unsubstituted $C_1$ to $C_{20}$ alkoxy group, and
p is an integer ranging from 0 to 5.

3. The photosensitive resin composition of claim 1, wherein the cardo-based binder resin comprises a terminal end group represented by Chemical Formula 5 at at least one or both terminal ends:

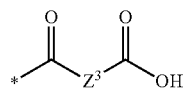

[Chemical Formula 5]

wherein, in Chemical Formula 5,
$Z^3$ is one of linking groups represented by Chemical Formulae 6-1 to 6-7,

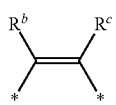

[Chemical Formula 6-1]

wherein, in Chemical Formula 6-1,
$R^b$ and $R^c$ are the same or different and are each independently hydrogen, a substituted or unsubstituted $C_1$ to $C_{20}$ alkyl group, an ester group or an ether group,

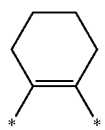

[Chemical Formula 6-2]

[Chemical Formula 6-3]

[Chemical Formula 6-4]

[Chemical Formula 6-5]

wherein, in Chemical Formula 6-5,
$R^d$ is O, S, NH, a substituted or unsubstituted $C_1$ to $C_{20}$ alkylene group, $C_1$ to $C_{20}$ alkylamine group or $C_2$ to $C_{20}$ alkenylamine group,

[Chemical Formula 6-6]

[Chemical Formula 6-7]

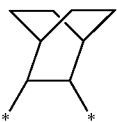

4. The photosensitive resin composition of claim 1, comprising the acrylic-based binder resin and the cardo-based binder resin in a weight ratio of about 1:9 to about 9:1.

5. The photosensitive resin composition of claim 1, wherein the acrylic-based binder resin has a weight average molecular weight of about 3,000 g/mol to about 40,000 g/mol.

6. The photosensitive resin composition of claim 1, wherein the cardo-based binder resin has a weight average molecular weight of about 500 g/mol to about 50,000 g/mol.

7. The photosensitive resin composition of claim 1, wherein the colorant comprises a pigment, a dye or a combination thereof.

8. The photosensitive resin composition of claim 1, wherein the initiator comprises a photopolymerization initiator, a radical polymerization initiator or a combination thereof.

9. The photosensitive resin composition of claim 1, wherein the photosensitive resin composition comprises:

about 1 wt % to about 30 wt % of the acrylic-based binder resin (A);
about 1 wt % to about 30 wt % of the cardo-based binder resin (B);
about 0.1 wt % to about 10 wt % of the reactive unsaturated compound (C);
about 0.01 wt % to about 10 wt % of the initiator (D);
about 10 wt % to about 40 wt % of the colorant (E); and
a balance amount of the solvent (F).

10. The photosensitive resin composition of claim 1, wherein the photosensitive resin composition further comprises malonic acid; 3-amino-1,2-propanediol; a silane-based coupling agent having a vinyl group or a (meth) acryloxy group; a leveling agent; fluorine-based surfactant; or a mixture thereof.

11. A photosensitive resin film manufactured using the photosensitive resin composition of claim 1.

12. The photosensitive resin film of claim 11, wherein a pattern in the photosensitive resin film has a tapered angle of greater than or equal to about 20° and less than about 60°.

13. A color filter including the photosensitive resin film of claim 11.

14. The photosensitive resin composition of claim 1, wherein a photosensitive resin film manufactured using the photosensitive resin composition has a tapered angle of greater than or equal to about 20° and less than about 60°.

* * * * *